(12) United States Patent
Chaine et al.

(10) Patent No.: US 7,253,064 B2
(45) Date of Patent: Aug. 7, 2007

(54) CASCODE I/O DRIVER WITH IMPROVED ESD OPERATION

(75) Inventors: Michael D. Chaine, Boise, ID (US); Manny K. F. Ma, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/853,538

(22) Filed: May 25, 2004

(65) Prior Publication Data

US 2004/0219760 A1 Nov. 4, 2004

Related U.S. Application Data

(62) Division of application No. 10/231,879, filed on Aug. 29, 2002, now Pat. No. 6,809,386.

(51) Int. Cl.
*H01L 21/336* (2006.01)
(52) U.S. Cl. .................. 438/296; 438/424; 257/E21.54
(58) Field of Classification Search ................ 257/355, 257/E21.54; 438/294, 296, 424
See application file for complete search history.

(56) References Cited

U.S. PATENT DOCUMENTS

| | | | |
|---|---|---|---|
| 4,487,639 A | 12/1984 | Lam et al. | |
| 4,551,743 A | 11/1985 | Murakami | |
| 4,683,637 A | 8/1987 | Varker et al. | |
| 4,769,687 A | 9/1988 | Nakazato et al. | |
| 4,992,843 A | 2/1991 | Blossfeld et al. | |
| 5,043,778 A | 8/1991 | Teng et al. | |
| 5,086,322 A | 2/1992 | Ishii et al. | |
| 5,258,642 A | 11/1993 | Nakamura | |
| 5,391,907 A | 2/1995 | Jang | |
| 5,436,183 A | 7/1995 | Davis et al. | .................. 437/40 |
| 5,473,500 A | 12/1995 | Payne et al. | |
| 5,565,375 A * | 10/1996 | Hiser et al. | ................. 438/213 |
| 5,581,104 A | 12/1996 | Lowrey et al. | ............. 257/355 |
| 5,767,552 A | 6/1998 | Casper et al. | ............... 257/379 |
| 5,780,897 A | 7/1998 | Krakauer | .................... 257/368 |
| 5,814,865 A | 9/1998 | Duvvury et al. | ............ 257/360 |
| 5,834,793 A | 11/1998 | Shibata | |
| 5,847,429 A | 12/1998 | Lien et al. | .................. 257/355 |
| 5,852,375 A | 12/1998 | Byrne et al. | |
| 5,852,540 A | 12/1998 | Haider | |
| RE36,024 E | 1/1999 | Ho et al. | .................... 257/356 |
| 5,877,046 A | 3/1999 | Yu et al. | |
| 5,880,917 A | 3/1999 | Casper et al. | ................. 361/56 |

(Continued)

OTHER PUBLICATIONS

Wolf, *Silicon Processing for the VLSI Era, vol. 2: Process Integration*, (Lattice Press, CA) 1990, pp. 45-58.*

(Continued)

*Primary Examiner*—Bradley K Smith
(74) *Attorney, Agent, or Firm*—Schwegman, Lundberg, Woessner & Kluth, P.A.

(57) ABSTRACT

A cascode I/O driver is described that includes a barrier formed in the shared region between the two transistors. The barrier region allows the I/O driver to be designed to primarily meet I/O requirements. Accordingly, improved operating speeds are achieved. An system is described that includes an I/O driver in parallel with an ESD device. In an embodiment, the I/O driver may assist the ESD device in discharging electrostatic, after the ESD begins conducting.

38 Claims, 9 Drawing Sheets

U.S. PATENT DOCUMENTS

| | | | |
|---|---|---|---|
| 5,930,094 A | 7/1999 | Amerasekera et al. | |
| 5,949,254 A | 9/1999 | Keeth | 326/87 |
| 5,956,598 A | 9/1999 | Huang et al. | |
| 5,982,599 A | 11/1999 | Ma et al. | 361/111 |
| 5,986,867 A | 11/1999 | Duvvury et al. | 361/111 |
| 6,013,936 A | 1/2000 | Colt, Jr. | |
| 6,091,594 A | 7/2000 | Williamson et al. | 361/111 |
| 6,096,610 A * | 8/2000 | Alavi et al. | 438/286 |
| 6,104,589 A * | 8/2000 | Williamson | 361/111 |
| 6,118,323 A | 9/2000 | Chaine et al. | 327/333 |
| 6,130,811 A | 10/2000 | Gans et al. | 361/56 |
| 6,137,338 A | 10/2000 | Marum et al. | 327/318 |
| 6,140,682 A | 10/2000 | Liu et al. | 257/355 |
| 6,147,538 A | 11/2000 | Andresen et al. | 327/309 |
| 6,181,540 B1 | 1/2001 | Schoenfeld et al. | 361/56 |
| 6,194,764 B1 | 2/2001 | Gossner et al. | 257/355 |
| 6,204,537 B1 | 3/2001 | Ma | 257/360 |
| 6,246,094 B1 | 6/2001 | Wong et al. | |
| 6,271,566 B1 | 8/2001 | Tsuchiaki | |
| 6,310,379 B1 | 10/2001 | Andresen et al. | |
| 6,331,469 B1 | 12/2001 | Park et al. | |
| 6,344,669 B1 | 2/2002 | Pan | |
| 6,346,729 B1 | 2/2002 | Liang et al. | |
| 6,399,973 B1 | 6/2002 | Roberds | |
| 6,465,852 B1 | 10/2002 | Ju | |
| 6,466,423 B1 | 10/2002 | Yu | 361/56 |
| 6,515,344 B1 * | 2/2003 | Wollesen | 257/530 |
| 6,700,151 B2 * | 3/2004 | Peng | 257/298 |
| 6,713,993 B2 * | 3/2004 | Descombes | 323/273 |
| 6,809,386 B2 * | 10/2004 | Chaine et al. | 257/368 |
| 6,826,026 B2 * | 11/2004 | Duvvury et al. | 361/56 |
| 6,958,518 B2 * | 10/2005 | Wylie | 257/395 |
| 2002/0142552 A1 | 10/2002 | Wu | |
| 2005/0275055 A1 * | 12/2005 | Parthasarathy et al. | 257/471 |

OTHER PUBLICATIONS

Anderson, Warren R., et al., "ESD Protection for Mixed-Voltage I/O Using NMOS Transistors Stacked in a Cascode Configuration", *20th Annual International EOS/ESD Symposium, IEEE Catalog No. 98TH8347*, (1998),98-54 thru 98-62.

* cited by examiner

CASCODE I/O DRIVER WITH IMPROVED ESD OPERATION

This application is a Divisional of U.S. application Ser. No. 10/231,879, filed Aug. 29, 2002, now U.S. Pat. No. 6,809,386, which is incorporated herein by reference.

TECHNICAL FIELD OF THE INVENTION

The present invention relates generally to integrated circuits (IC's) and, more particularly to circuitry within the IC to drive the input/output signal.

BACKGROUND OF THE INVENTION

An IC chip electrically communicates with off-chip electronics to exchange information. The IC chip may employ a different voltages than are employed by off-chip electronics. Accordingly, the interface between the IC chip and off-chip electronics must accommodate the voltage differences. One such interface includes a mixed voltage input/output ("I/O") driver as discussed in ESD Protection For Mixed-Voltage I/O Using NMOS Transistors Stacked In A Cascode Configuration, by Warren Anderson and Davis Krakauer and published in EOS/ESD Symposium 98-55, herein incorporated by reference. FIGS. 2 and 3 of this publication show an ESD protection structure including two NMOS transistors in a cascode configuration, where the transistors are merged into the same active area of a substrate. The two NMOS transistors allows a 5V signal to be dropped to 3.3V during normal operation while providing a parasitic lateral NPN bipolar transistor during electrostatic discharge. Under ESD conditions, the stacked transistors operate in snapback with the bipolar effect occurring between the source of the bottom NMOS transistor and drain of the top NMOS transistor. While this I/O driver has been used for some generic designs, it has been a continuing challenge to balance electrostatic discharge protection performance and I/O performance. Accordingly, it is desired to improve upon the performance of a cascode MOS driver. More specifically, there is a need to remove the ESD design constraints from drivers to achieve maximum I/O performance.

SUMMARY OF THE INVENTION

Upon reading and understanding the present disclosure it is recognized that the inventive subject matter described herein provides novel structures and methods and may include novel structures and methods not expressed in this summary. The following summary is provided to give the reader a brief summary which is not intended to be exhaustive or limiting and the scope of the invention is provided by the attached claims and the equivalents thereof.

An embodiment of the present invention includes an I/O device having two transistors in a cascode configuration with a shared diffusion region with a spacing region therein. In an embodiment, the spacing region is non-conductive. In an embodiment, the transistors are NMOS transistors.

An embodiment of the present invention includes integrated circuit that includes a substrate, a first MOS transistor, and a second MOS transistor in a cascode configuration with the first MOS transistor. The first MOS transistor and the second MOS transistor have a shared diffusion region that has a barrier region therein. The barrier region divides the shared diffusion region into two sub-regions. The sub-regions being spaced from each other by the barrier region. One subregion is the source of the first transistor. The second sub-region is the drain of the second transistor.

An embodiment of the present invention includes an integrated circuit having a substrate including an active well, a first MOS transistor connected to the active well, and a second MOS transistor connected to the active well, the second transistor being in a cascode configuration with the first transistor with the source of the first transistor and the drain of the second transistor being connected to a shared region. The cascode connected transistors form a parasitic bipolar transistor in the active well between the drain of the first transistor and the source of the second transistor. The shared region includes a spacing separating the source of the first transistor and the drain of the second transistor.

An embodiment of the present invention includes an integrated circuit including a substrate, a contact pad on the substrate, and an I/O driver circuit on the substrate and connected to the contact pad. The I/O driver circuit includes a first MOS transistor on the substrate and a second MOS transistor in a cascode configuration with the first MOS transistor. The first MOS transistor and the second MOS transistor having a shared diffusion region, the shared diffusion region having a spacing region therein.

An embodiment of the present invention includes a cascode I/O driver that has one MOS transistor having a grounded gate and another MOS transistor having a floating gate.

An embodiment of the present invention includes a method of forming an I/O driver device including forming a first transistor in a substrate, forming a second transistor in the substrate having a shared region with the first transistor, and forming a barrier in the shared region. In an embodiment, the first transistor and the second transistor are simultaneously formed in the substrate such that the first and second transistors are in a cascode configuration with a shared region.

An embodiment of the present invention includes improving I/O driver operation of a cascode-type driver of an integrated circuit by inserting a gap in the common node of the cascode-connected transistors. This is achieved by removing ESD design constraints from the design of the I/O driver.

Other embodiments of the present invention include electrical I/O systems that include and I/O driver and an electrostatic discharge circuit and methods for forming the systems.

Further features and advantages of the present invention, as well as the structure and operation of various embodiments of the present invention, are described in detail below with reference to the accompanying drawings.

DESCRIPTION

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention. The terms wafer and substrate used herein include any structure having an exposed surface onto which a layer is deposited according to the present invention, for example, to form the integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

Figure 1:
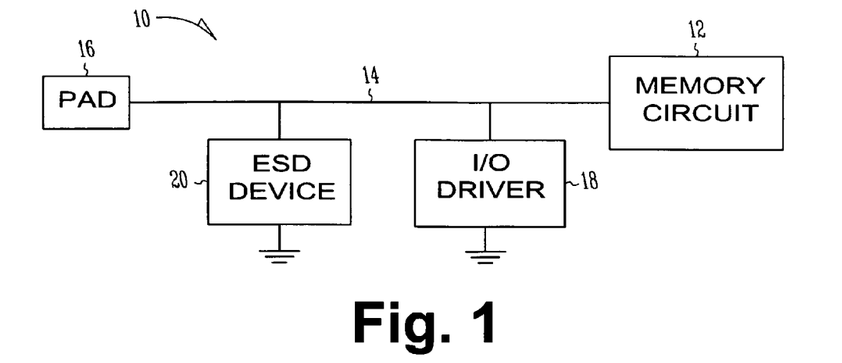
FIG. 1 shows a circuit according to the present invention.

FIG. 1 shows a block diagram of an IC circuit 10 according to the present invention. Circuit 10 includes an integrated circuit 12 connected to a communication line 14. The integrated circuit 12 includes a powered, on state and an unpowered, off state. ESD events typically occur with the integrated circuit 12 in the unpowered state. In an embodiment, integrated circuit 12 includes a memory array. The memory circuit is, in an embodiment, a dynamic random access memory (DRAM). In other embodiments the memory circuit includes at least one of SRAM (Static Random Access Memory) or Flash memories. Additionally, the DRAM could be a synchronous memory device such as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging memory technologies as known in the art. A memory circuit includes an addressable array of memory cells, which contain IC capacitors and IC access transistors. The memory circuit further includes an address circuit that activates select rows and columns in the memory array based on an address signal and a clock signal. Communication line 14 is a conductor capable of transmitting an electrical signal such as a high or low voltage signal from the circuit 12 to an input/output pad 16 that connects the circuit 12 to an external circuit or bus. In an embodiment, communication line 14 is a metal trace that extends from an internal contact to an external pad 16. External pad 16 is also a metal component. An input/output driver 18 translates mixed voltage levels between the memory circuit 12 and the pad 16, which is connected to off chip electrical circuits. I/O driver 18 connects the line 14 to ground. An electrostatic discharge device 20 is connected in parallel to the driver 18. In an embodiment, the ESD device 20 and not the I/O driver 18 connects the line 14 to ground. In an embodiment, I/O driver 18 connects to an IC power supply. In an embodiment, the IC power supply supplies Vss. In an embodiment, both the ESD device and the I/O driver connect line 14 to a power supply rail in the integrated circuit. ESD protection devices are discussed in U.S. Pat. Nos. 6,204,537; 6,181,540; 6,140,682; 6,130,811; 6,104,589; 5,880,917; 5,982,599; 5,847,429; 5,780,897; 5,767,552; 5,581,104; 5,436,183; and Re. 36,024, all incorporated herein by reference.

Figure 2:
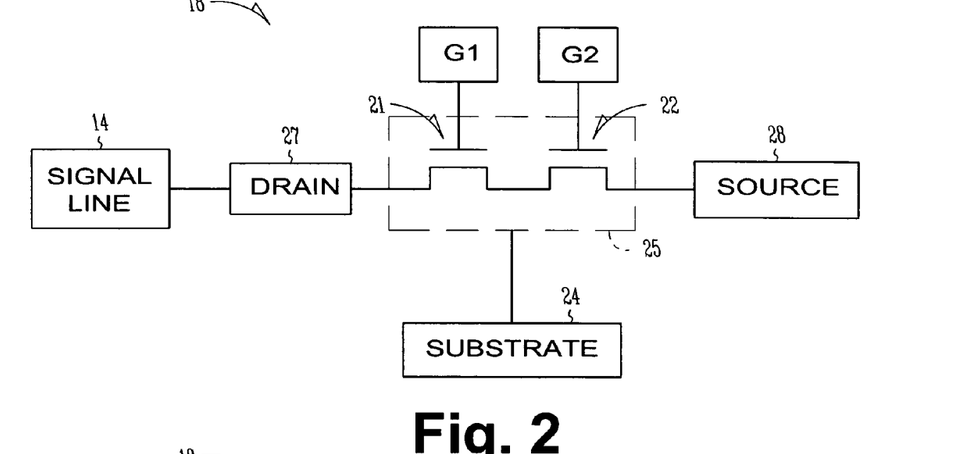
FIG. 2 shows an electrostatic discharge device according to the teachings of the present invention.

FIG. 2 shows an embodiment of the device 18 according to the present invention, which includes two cascode connected transistors 21, 22 formed in a substrate 24. In an embodiment, device 18 acts as an ESD under specific operating conditions. In an embodiment, the one specific operating condition is a voltage on the communication line 14 that is higher than the ESD device 20 trigger voltage. The cascode connection of transistors 21, 22 includes the source of transistor 21 being formed in a same region 25 of the substrate as the drain of transistor 22. The drain 27 of transistor 21 is connected to line 14. The source 28 of transistor 22 is connected to Vss or ground. The gate of the transistor 21 is connected to gate control circuit G1. The gate of the transistor 22 is connected to gate control circuit G2. In normal operation, the I/O device 18 allows the voltage on the signal line to drop. For example, some ICs operate at a five volt level and other ICs operate at a 3.3 volt level. I/O device 18 allows the voltage to drop from five volts to 3.3 volts. It is within the scope of the present invention to use the I/O device 18 to connect ICs and/or buses having voltages mismatches that are other than 5 volts and 3.3 volts. Under ESD conditions, a parasitic bipolar effect occurs between the drain 27 and the source 28 with the drain acting as a bipolar collector and the source acting as a bipolar emitter.

Figure 3:
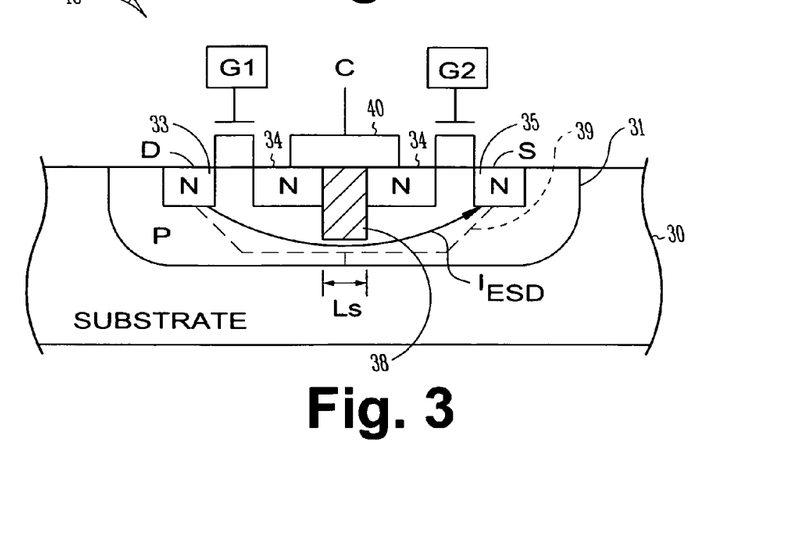
FIG. 3 shows a cross-sectional view of an integrated circuit embodiment of the present invention.

FIG. 3 shows a cross-sectional view of an embodiment of the I/O device 18 of the present invention. A well 31 having a first diffusion type is formed in a substrate 30. In an embodiment, well 31 is a P-type. Three regions 33, 34, 35 of a second diffusion type are formed in the well. In an embodiment, the second diffusion type is N-type. Region 33 forms the drain 27 of transistor 21. Region 35 forms the source 28 of transistor 22. The center region 34 is the shared diffusion region of the cascode connected transistors of the present invention. The center region 34 is divided into two sub-regions by a non-conductive barrier or insulative region 38. In an embodiment, the non-conductive barrier region 38 is a shallow trench isolation area. Region 38 acts as a spacer separating the regions 34. In an embodiment, the region 38 has depth greater than the region 34. In an embodiment, region 38 has a depth essentially equal to the depth of region 34. In an embodiment, the barrier region 38 is significantly less conductive than the regions 34. The two sub-regions of center region 34, in an embodiment, are connected together external of the sub-regions. For example, a metal layer connects the two sub-regions of center region 34. The width of the non-conductive region, designated Ls in FIG. 3, is selected to increase the base width of the parasitic NPN bipolar transistor 39 (shown in broken line in FIG. 3) while preserving the surface area of the device. As more IC devices are fabricated on a single chip or die, it is desirable to preserve the surface area. Accordingly, the width Ls of the non-conductive region 38 is less than its depth. The increased base width of the NPN transistor 39 results in the transistor having a reduced emitter efficiency, a smaller base transport factor, and less sensitivity to base width modulation, which are desirable in a parasitic BJT transistor. The reduced emitter efficiency contributes to a higher breakdown voltage. Further, the increased base width of the parasitic BJT transistor 39 increases its trigger voltage.

In fabricating I/O device 18, a substrate 30 is provided and masked to expose the region of the well 31. The well 31 is then doped. In an embodiment, well 31 is doped with a P-type dopant. The substrate 30 and doped well 31 are masked to define the regions 33, 34, 35. These regions are doped with a second type of dopant. In an embodiment, regions 33, 34, 35 are doped with an N-type dopant. The region 34 is formed as a single, continuous region. The substrate 30, and more specifically, region 34 is then masked to define the insulating barrier region 38. The region 34 is etched to form a trench in the region 34. The trench extends at least to a depth as described herein. Thereafter, the trench is filled with a non-conductive material to form the insulating barrier region 38. The mask is removed. The substrate 30 is thereafter masked to define the gates intermediate the regions 33 and 34 and regions 34 and 35. The gate material is deposited in the defined areas. Further, the substrate 30 is masked to form a contact 40 that connects the two portions of region 34 that are separated by the non-conducting barrier region 38. Contacts are also made to regions 33, 35, which act respectively as the drain 27 and source 28.

Figure 4:
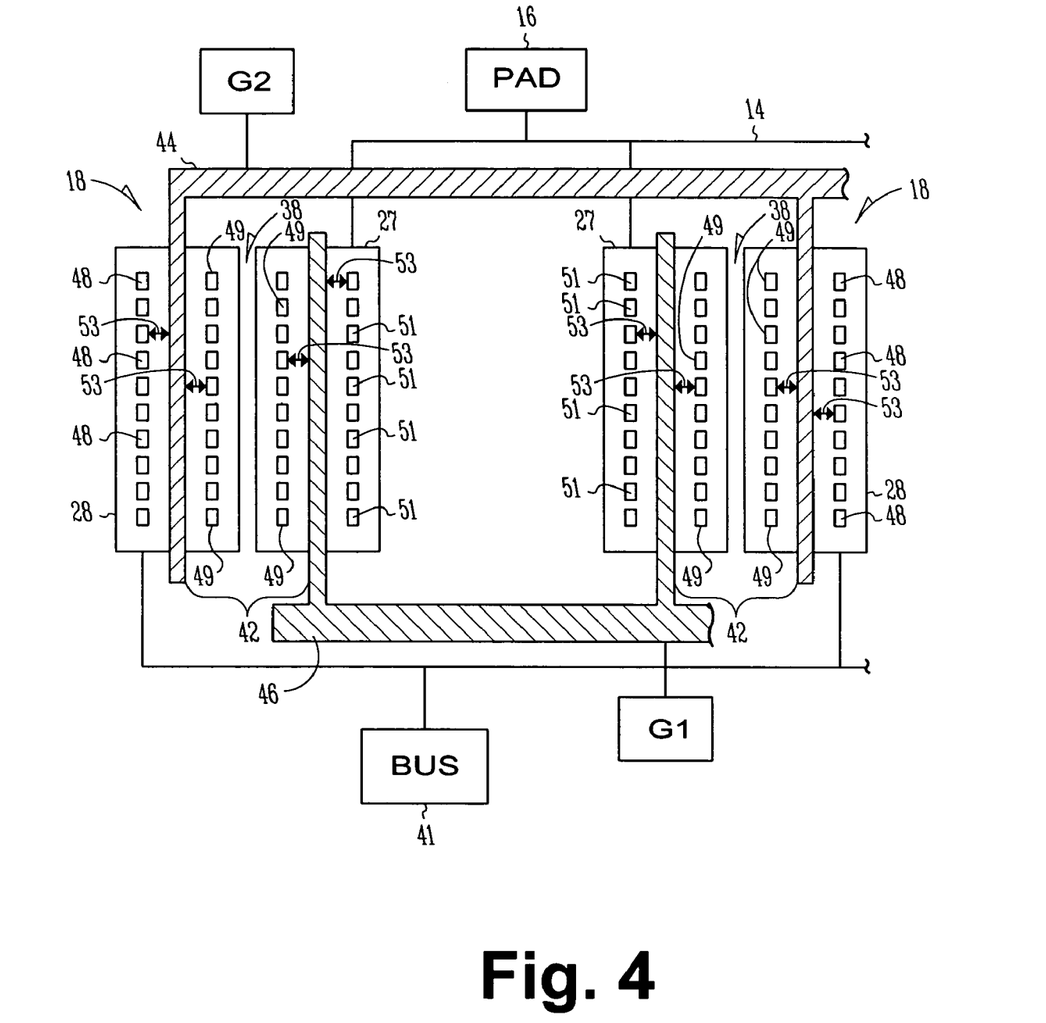
FIG. 4 shows a plan view of an embodiment of the present invention.

A method of fabricating the I/O device 18 according to the present invention includes providing a substrate 30, forming a first transistor 21 in the substrate, and forming a second transistor 22 in the substrate having a shared region 34 with the first transistor. A barrier region 38 is formed in the shared region. The barrier region 38 has a width Ls that extends the base width of the parasitic transistor 39. In an embodiment, barrier region 38 is formed by shallow trench isolation techniques. In an embodiment, barrier region 38 is formed by removing a central portion of the shared region 34 and inserting a non-conductive material in the removed central portion, i.e., a trench, in the shared region. The trenched central portion of the shared region 34 is formed by etching the shared region, which in an embodiment is doped as an N type. In an embodiment, the etching extends through the N-type region and into the p-type well 31. In an embodiment, at least one of the first transistor 21 and the second transistor 22 is a MOS transistor. In an embodiment, the transistors 21 and 22 are NMOS devices. Accordingly, the first and second transistors 21, 22 are formed in a same active well in the substrate. In an embodiment, the active well is doped as a P-type. In an embodiment, the first transistor 21 and the second transistor 22 are simultaneously formed in the substrate by masking the dopant regions for both transistors that receive the same dopant type. The mask creates openings through which the doping of the substrate is controlled to create the regions 33, 34, 35. In an embodiment, the region 33 is formed to a depth of about 0.2 micron and a width of greater than 1.0 micron. The dimension into the paper as shown in FIG. 3 and top to bottom in FIG. 4 is in the range of 15 to 30 microns. These dimensions are typically based off the drive requirements of the device. This illustrates that the bottom surface area of region 33 is greater than one of the side surface areas of region 33. In an embodiment, the width is about five times the depth (shown vertically in FIG. 3) of region 33. In an embodiment, region 35 is fabricated at the same time using the same masks to the same dimensions as region 33.

In operation the I/O driver 18 is in an I/O driver mode with the current flowing through transistors 21, 22. When the voltage across the I/O driver 18 exceeds its bipolar avalanche breakdown voltage, the driver 18 will assist the ESD device 20 in dissipating the electrical charge. In an embodiment, the bipolar avalanche breakdown voltage of the I/O driver is set higher than the voltage level at which the ESD device 20 begins conducting. The I/O driver thus acts as a secondary ESD device with its parasitic bipolar junction transistor conducting. The I/O driver 18 forces the current deep into the well 31. This is accomplished by the non-conductive region 38 extending to at least past the bottom of region 34.

The depth of the non-conducting, barrier region 38 forces the ESD current deeper into the well 31. Barrier region 38 blocks the surface ESD current. In a preferred embodiment, barrier region 38 has a depth greater than the depth of the shared region 34 and less than the depth of the well 31. In an embodiment, barrier region 38 has a depth that is at least 50% greater than the depth of region 34. In an embodiment, barrier region 38 has a depth that is at least 75% greater than the depth of region 34. In an embodiment, barrier region 38 has a depth that is at least about twice as deep as region 34. In an embodiment, barrier region 38 has a depth that is at least about 2.5 times as deep as region 34. In an embodiment, barrier region 38 has a depth that is at least about three times as deep as region 34. For example, when region 34 has a depth of 0.2 micron, then the barrier region is in the range of about 0.3 to about 0.6 micron. In another example, the depth of barrier region 38 is about 0.5 micron. Moreover, the depth of the barrier region 38 must be less than the depth of the well 31. In an embodiment, well 31 is at least about 0.5 microns deeper than the bottom of barrier region 38. In an embodiment, well 31 is at least about 1.0 microns deeper than the bottom of barrier region 38. It is believed that the closer the bottom of barrier region 38 gets to the bottom of well 31 will cause the breakdown voltage of the parasitic bipolar transistor 39 to increase.

Conventional cascode ESD device, which does not have the non-conductive region 38, allows the current in an ESD event to flow across the surface from region 33 to region 34 and from region 34 to region 35. That is, a conventional cascode ESD device allows all of the current to flow on the surface directly beneath the gates of the two cascoded transistors between the source and drain regions. In contrast, the present cascode I/O device 18 does not allow the current to flow through the surface. The current $I_{ESD}$ flowing through the parasitic transistor 39 is forced by the non-conductive region 38 to flow deep into the well 31 beneath the non-conductive region during an ESD event. The present I/O device produces more bulk current in the well than a conventional cascode ESD device. The deeper bulk currents use more volume of the well. The present I/O device thus produces less heat per unit area and unit volume than conventional cascode ESD devices.

In an embodiment, the ESD event occurs when the integrated circuit device 12 is in an un-powered, off state. For example, a high voltage ESD pulse or spike is applied to the I/O line 14. In the un-powered state, substrate 30 is floating, that is, not biased. In an embodiment and in the powered or on state of the integrated circuit device 12, the substrate is biased to a negative potential (Vbb). The floating substrate allows essentially all of the current from the ESD pulse to bias the emitter of the parasitic bipolar transistor 39. In an embodiment, the voltage required to forward bias transistor 39 is about 0.6 volts.

In an embodiment, the bottom surface area of drain 33 is greater than the side surface. The bottom surface area of the source 35 is greater than the side area. The current in the I/O device 18 during an ESD event will flow out of the bottom of the drain 33 into the well and into the bottom of the source 35. By flowing the current through the surfaces of the drain 33 and source 35 that are the greater surface areas the heat generated by electron flow is spread over greater area. This allows the I/O device to handle a greater current than conventional cascode ESD device. On the other hand, if the present I/O device 18 is designed for the same current capacity as conventional cascode ESD devices, then the drain 33 and source 35 can be made smaller than the conventional devices. This saves the real estate on a die. Moreover, the capacitance is dependent on the area of the bottom surface of the drain 33 and source 35. Reducing the surface area of at least one of the source region 33 and drain region 35, the capacitance is reduces. In an embodiment, the bottom surface area of the drain 35, which is connected to the I/O line 14, is reduced. The capacitance that is reduced is the active area to well capacitance. This allows the present I/O device to operate at faster speeds.

FIG. 4 shows a plan view of an I/O device according to an embodiment of the present invention. This embodiment includes two I/O devices 18. The I/O pad 16 is connected to the drain 27 of the first transistors of each of the I/O devices 18. A bus 41 is connected to the source of the second transistors of each of the I/O devices 18. In an embodiment, bus 41 is connected to ground or Vssq. Each of the two I/O devices 18 includes a common area 42 divided by barrier 38. A gate controller G2 is connected to a communication trace 44 that provides the gate signal, which controls the second gate, to each of the I/O devices 18. A gate controller GI is connected to a communication trace 46 that provides the gate signal, which controls the first gate, to each of the I/O devices 18. A plurality of contacts 48 for the source of each of the second gates are illustrated. Contacts 48 connect the source region 35 to the bus 41. A plurality of contacts 49 for the common area 42 for each of the I/O devices 18. Contacts 49 connect the portions of the common area 42 to each other. For example, the contacts 49 are connected together through the conductor trace (not shown). A plurality of contacts 51 are shown on the drain region of each of the first transistors. In an embodiment, the contacts 51 have a width of about 0.15 micron. Contacts 51 are essentially positioned on a center line, i.e., equidistant from right edge and the finger of gate GI, in region 27. Contacts 51 connect the drain region through communication line 14 to pad 16. Transistors have numerous contacts such as contacts 48, 49 and 51 as shown. One way to improve communication speed is to reduce the capacitance. The higher the capacitance, the slower the I/O communication of the IC with external systems through pad 16. Speed reducing capacitances include the active regions 33, 35 to well 31 capacitances. Accordingly, the area of the drain region 27 is reduced. This reduces the capacitance of the I/O driver 18. In an embodiment, the width (shown right to left in FIG. 4) of drain region 27 is about 1.05 micron. The I/O driver 18 is used with an ESD device in an embodiment. This removes the design constraints from the selection of the area of the drain region 27. Further, when the I/O driver 18 acts as ESD protection assist device, thus allowing the contact to gate spacing 53 to be reduced due as the main ESD protection device 20 is designed to carry the bulk of the initial ESD current. The present I/O devices 18 are not designed with ESD protection as a criteria, thus, the contact to gate spacing is reduced by reducing the size of the drain (N+) active area. More specifically, the bottom surface area of drain 33 is smaller. This drain to well capacitance is reduced as the area of one of the surfaces that acts as a capacitive plate is reduced. The capacitance of the I/O driver 18 is reduced. Moreover, the operating speed of the I/O driver 18 increases. In an embodiment, the contact to gate spacing is about 0.45 micrometers. In an embodiment, the contact to gate spacing is about 0.4 micrometers. In an embodiment, the contact to gate spacing is less than about 0.45 micrometers. In an embodiment, the contact to gate spacing is less than 0.4 micrometers.

Figure 5:
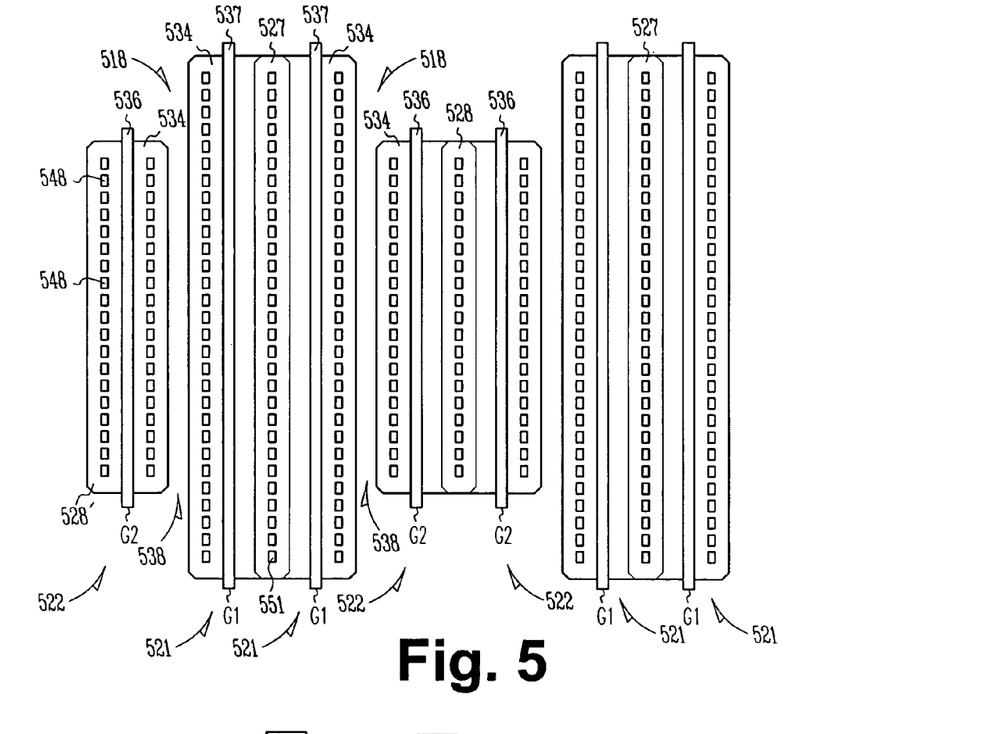
FIG. 5 shows a plan view of an embodiment of the present invention.
Figure 6:
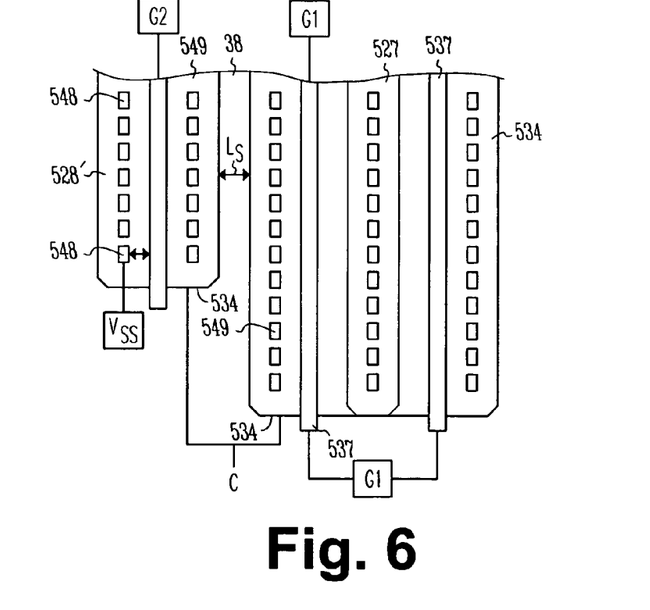
FIG. 6 shows a partial, enlarged plan view of the FIG. 5 embodiment of the present invention.

FIGS. 5 and 6 show a plan view of an embodiment of the I/O driver of the present invention. FIG. 6 is an enlarged partial view of FIG. 5. FIG. 5 shows a plurality of I/O devices 518 laid out one next to the other that have alternating common first transistor drains 527 and common second transistor source 528. That is a plurality of first transistors, e.g., transistor 21 of FIG. 2, and second transistors, e.g., transistor 22 of FIG. 2, are shown. The order of the first and second transistors alternate. That is the second transistor 522 is immediately followed by a first transistor 521, which is immediately followed by another first transistor 521, which is then followed by a second transistor 522. This second transistor 522 is then flowed by another first transistor 521, which is immediately followed by another first transistor 521. Thus, when the first transistors 521 are adjacent each other they can share a drain and its contacts. Further, when the second transistors 522 are adjacent each other they can share a source and its contacts. Further, the I/O driver have a reduced area drain region 527 and smaller contact to gate spacings.

The left I/O device 518 includes, from left to right in FIG. 5, a second transistor 522 then a first transistor 521. A source 528' of the second transistor 522 is not shared by another device and has a plurality of contacts 548. A second transistor gate 536 follows, again left to right, the source 528'. Common region 534 is shared by the two cascode connected transistors 522, 521, which are respectively controlled by the gate 536 and a first transistor gate 537. Common region 534 includes a plurality of contacts 549 on each side of an insulating region 538 that divides the common region 534 in to a separate sub-region for each of the first and second transistors 521, 522. The first transistor gate 537 is adjacent the portion of the shared region 534 remote the gate 536 of the other transistor 522. Adjacent the gate 537 remote from the common region 534 is the shared drain 527, which includes a plurality of contacts 551. The shared drain 527 is adjacent a further gate 537 of another of the first transistors 521. Adjacent the gate 537 remote from the shared drain 527 is a further shared region 534 that is divided by a further insulating barrier 538. Adjacent the further shared region 534 is another second transistor gate 536, which is in turn adjacent a shared second transistor source region 528. A further second transistor 522 shares the region 528. A further first transistor 521 is connected to the further second transistor 522 through another shared region 534. In an embodiment, the layout then repeats itself with a first transistor, then second transistor, then second transistor, and first transistor. Accordingly, it is possible to provide a plurality of I/O devices 18 that share source or drain regions.

FIGS. 4-6 show how a plurality of I/O devices 18 could be combined to provide the characteristics of a complete integrated circuit device. That is, a plurality of I/O devices 18 are formed on a die to meet the die design specifications, e.g., drive specifications.

Figure 7A:
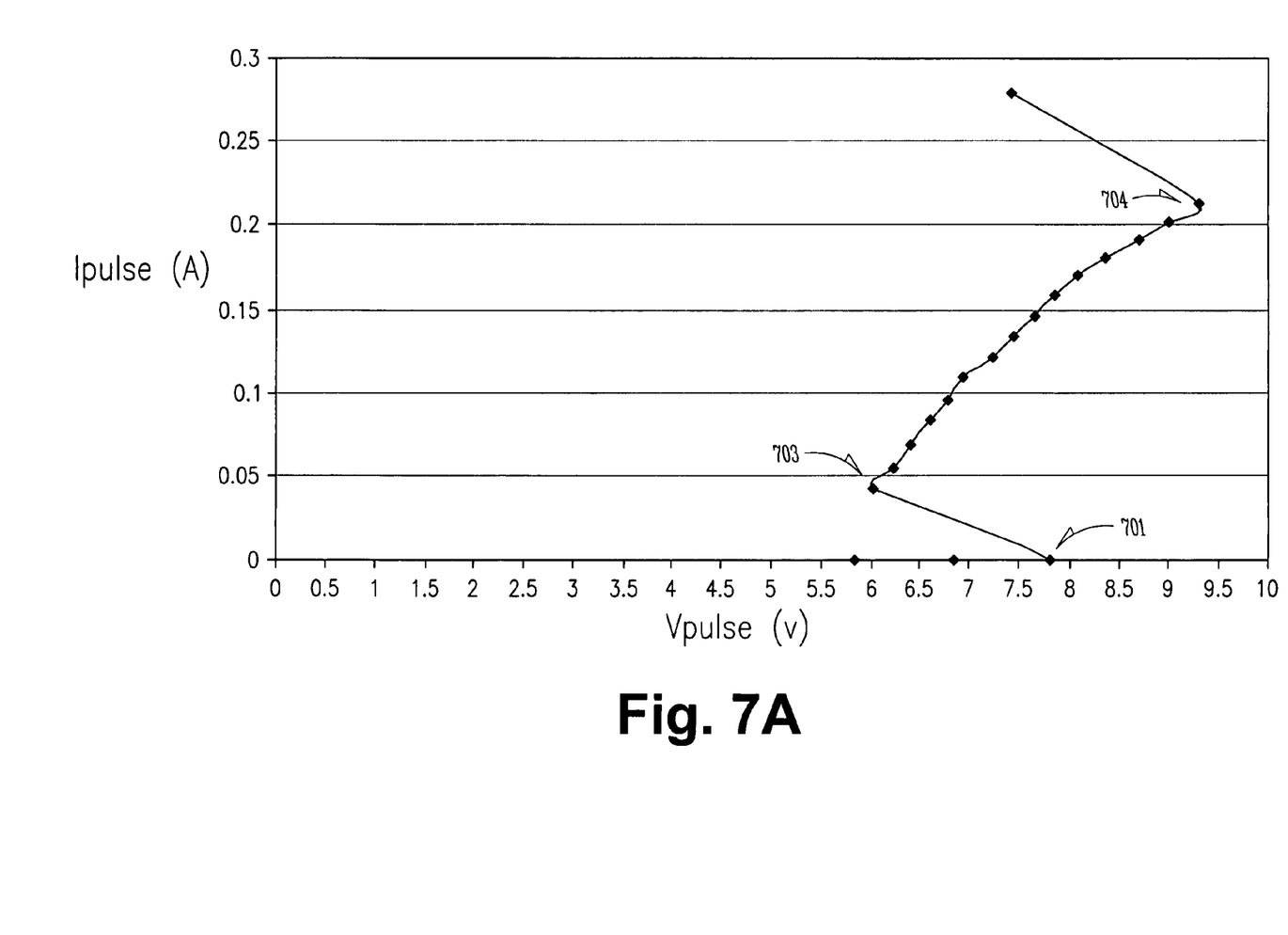
FIG. 7A is a graph of current versus voltage using the transmission line pulse (tlp) method connected to an I/O device according to the present invention having a first gate bias configuration.

FIG. 7A shows a transmission line pulse (tlp) current/ voltage graph. This graph shows data points of an I/O device according to the present invention. The I/O device, such as device 18, is biased with the first gate (GI) grounded and the second gate (G2) floating or unbiased. The I/O device while not designed as an ESD device does has an ESD assist operating mode that will assist the ESD device 20 when the communication line 14 experiences a certain trigger voltage. The graph of FIG. 7A shows a parasitic transistor trigger voltage 701 of about 7.75 volts for an I/O device of the present invention. In an embodiment, the trigger voltage is about 8.0 volts. Thus, the ESD device 20 in the embodiment shown in FIG. 1 must have a trigger voltage of less than 7.75 volts. This provides the system 10 with ESD protection with only the ESD device 20, ESD protection with the ESD device assisted by the parasitic transistor of the I/O device, and the ability to design I/O driver 18 without ESD protection factors. In an embodiment, the trigger voltage for the ESD device 20 is about 1.0 volt less than the trigger voltage of the parasitic transistor of the I/O device 18. In operation, the ESD device 20 will trigger and begin conducting when a voltage of about 7 volts is on line 14. Ideally, the ESD Device 20 will conduct all of the current and the parasitic transistor of I/O device 18 will not be triggered. However, if the voltage on line 14 rises above the trigger voltage 701 of the I/O device 18, it will assist the ESD device 20 in dissipating the electrostatic charge.

FIG. 7A further shows operating characteristics of the I/O device after its parasitic transistor, e.g., BJT 39 of FIG. 3, begins conducting. Once the parasitic transistor of the I/O device begins conducting, it will continue to conduct until the voltage on line 14 falls below a minimum holding voltage 703. The minimum holding voltage in the embodiment show in FIG. 7A is about 6.0 volts. In an embodiment, the I/O device 18 conducts in its ESD assist operating mode up to a maximum of about 10 milliamps per micron before the I/O device is damaged. It will be appreciated that the I/O device 18 of system 10 is designed principally to reduce active area to well capacitance to improve the operating speed of the I/O system 10. The I/O device 18 secondarily provides ESD protection characteristics. In an embodiment, the I/O device 18 provides assistance to a primary ESD protection device 20. Accordingly, the I/O device 18 provides ESD assistance to the ESD device 20 with gate of the first transistor 21 grounded and the gate of the second transistor 22 floating.

Figure 7B:
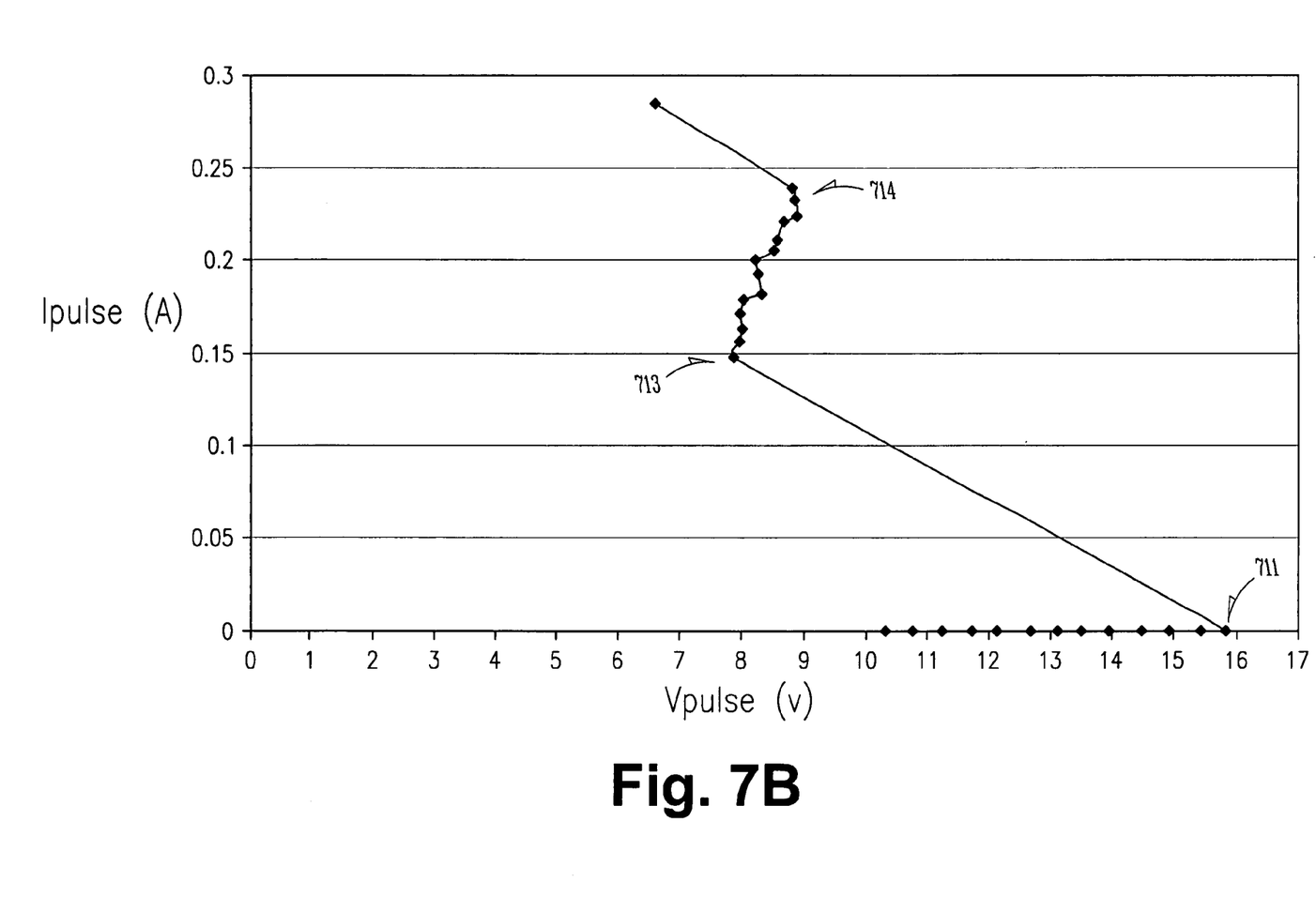
FIG. 7B is a graph of current versus voltage in the transmission line pulse (tlp) method connected to an I/O device according to the present invention having a second gate bias configuration.

FIG. 7B shows a transmission line pulse (tlp) current/ voltage graph. This graph shows data points of an I/O device according to the present invention. The I/O device, such as device 18, is biased with the first gate (G1) floating and the second gate (G2) grounded. In this biased operating mode, the I/O device of the present invention has a trigger voltage 711 of greater than 14 volts. Thus, the trigger voltage in the FIG. 7B biased operating mode of the I/O device is significantly higher than that of the operating mode shown in FIG. 7A. In an embodiment, the trigger voltage 711 is about 16 volts. The holding voltage 713 is about 8.0 volts. Accordingly, if it is desired that the parasitic transistor, e.g. BJT 39 in FIG. 3, essentially never acts as an ESD than the first gate 21 has a floating gate and the second gate 22 has a grounded gate.

The cascode I/O device 18 in an embodiment of the present invention is biased so that its parasitic transistor will be non-conducting when the ESD device 20 begins conducting. In an embodiment, the trigger voltage for the parasitic transistor of the I/O device 18 is about 20% higher than the trigger voltage for the ESD device 20. Moreover, the width Ls of the spacer 38 is adjusted to vary the breakdown voltage of the parasitic transistor. The wider Ls, the greater the trigger voltage.

The cascode I/O driver device 18 of the present invention allows the pad capacitance to be lower to meet high speed communication requirements by removing the ESD design requirements from the design of the I/O driver. The pad capacitance of system 10 is less than 2.4 pF. In an embodiment, pad capacitance of system 10 is less than 2.0 pF.

Semiconductor Dies

Figure 8:
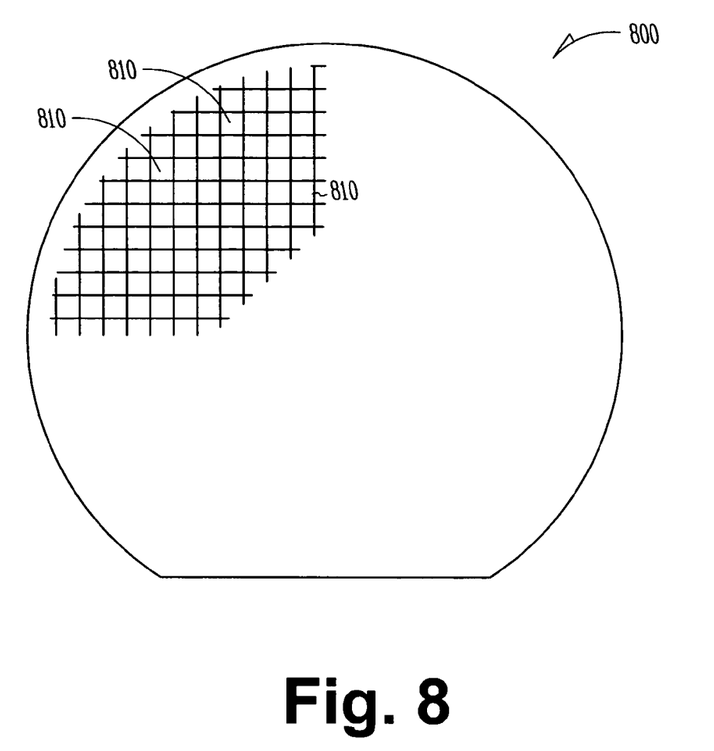
FIG. 8 is a plan view of a wafer containing semiconductor dies according to the present invention.

With reference to FIG. 8, for an embodiment, a semiconductor die 810 is produced from a substrate such as wafer 800. A die is an individual pattern, typically rectangular, on a substrate that contains circuitry, or integrated circuit devices, to perform a specific function, such as memory functions, logic functions, and address functions. A semiconductor wafer will typically contain a repeated pattern of such dies containing the same functionality. Dies 810 contain circuitry for the inventive I/O device, as discussed above. Die 810 may further contain additional circuitry to extend to such complex devices as a monolithic processor with multiple functionality. Die 810 is typically packaged in a protective casing (not shown) with leads extending therefrom (not shown) providing access to the circuitry of the die for unilateral or bilateral communication and control. Each die 810 may contain at least one of the I/O devices according to the present invention. In an embodiment, the leads are connected to the I/O pad 16.

Circuit Modules

Figure 9:
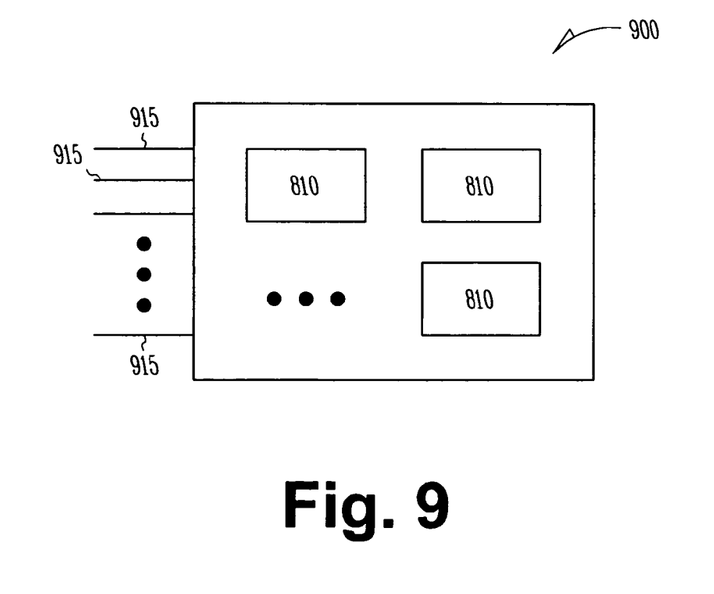
FIG. 9 is a block diagram of a circuit module according to the present invention.

As shown in FIG. 9, two or more dies 810 are combined, with or without protective casing, into a circuit module 900 to enhance or extend the functionality of an individual die 810. Circuit module 900 includes a combination of dies 810 representing a variety of functions, or a combination of dies 810 containing the same functionality. One or more dies 810 of circuit module 900 contain at least one I/O device in accordance with the present invention.

Some examples of a circuit module include memory modules, device drivers, power modules, communication modems, processor modules and application-specific (ASIC) modules, and may include multilayer, multichip modules. Circuit module 900 may be a subcomponent of a variety of electronic systems, such as a clock, a television, a cell phone, a personal computer, personal data assistant, an automobile, an industrial control system, an aircraft and others. Circuit module 900 will have a variety of leads 915 extending therefrom and coupled to the dies 810 providing unilateral or bilateral communication and control.

Figure 10:
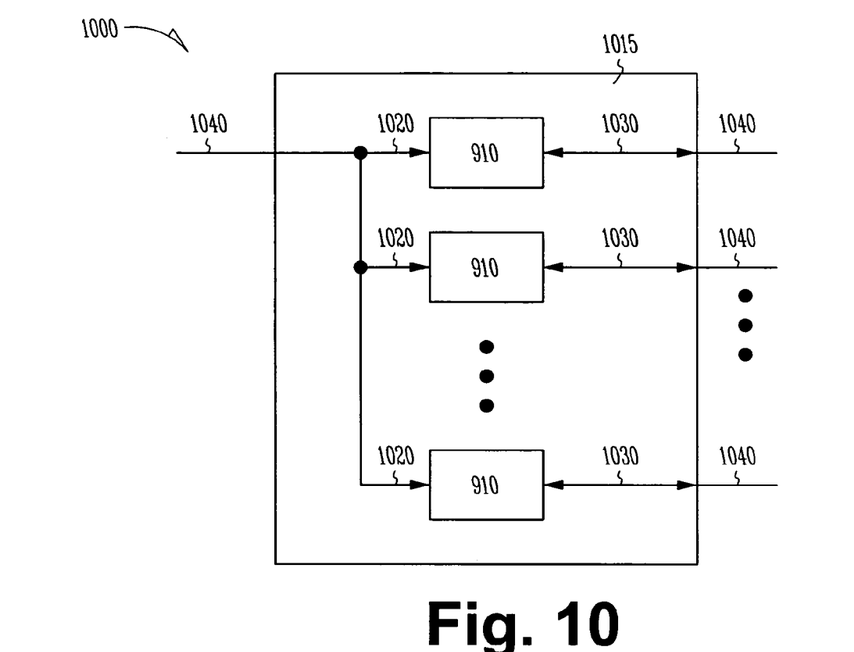
FIG. 10 is a block diagram of a memory module according to the present invention.

FIG. 10 shows one embodiment of a circuit module as memory module 1000. Memory module 1000 contains multiple memory devices 910 contained on support 1015, the number generally depending upon the desired bus width and the desire for parity. Memory module 1000 accepts a command signal from an external controller (not shown) on a command link 1020 and provides for data input and data output on data links 1030. In an embodiment, an I/O device of the present invention is connected to at least one of the command link 1020 or the data I/O links 1030. The command link 1020 and data links 1030 are connected to leads 1040 extending from the support 1015. Leads 1040 are shown for conceptual purposes and are not limited to the positions shown in FIG. 10. In an embodiment, at least one of the memory devices 910 contains an I/O device according to the present invention.

Electronic Systems

Figure 11:
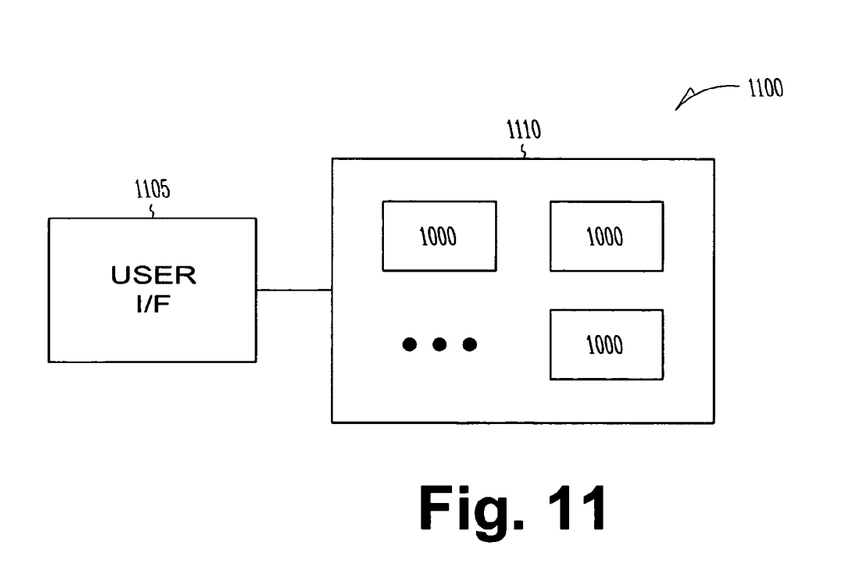
FIG. 11 is a block diagram of a electronic system according to the present invention.

FIG. 11 shows one embodiment of an electronic system 1100 containing one or more circuit modules 1000. Electronic system 1100 generally contains a user interface 1105 that communicates with an electronic unit 1110. User interface 1105 provides a user of the electronic system 1100 with some form of control or observation of the results of the electronic unit 1110. Some examples of user interface 1105 include the keyboard, pointing device, monitor or printer of a personal computer; the tuning dial, display or speakers of a radio; the ignition switch, gauges or gas pedal of an automobile; and the card reader, keypad, display or currency dispenser of an automated teller machine. User interface 1105 may further provide access ports provided to electronic unit 1110. Access ports are used to connect an electronic unit to the more tangible user interface components previously exemplified. In an embodiment, user interface 1105 electrically communicates with unit 1110 and the communication line includes an I/O device according to the present invention. One or more of the circuit modules 1000 include a processor providing some form of manipulation, control or direction of inputs from or outputs to user interface 1105, or of other information either preprogrammed into, or otherwise provided to, electronic unit 1110. As will be apparent from the lists of examples previously given, electronic system 1100 will often be associated with certain mechanical components (not shown) in addition to circuit modules 1000 and user interface 1105. It will be appreciated that the one or more circuit modules 1000 in electronic system 1100 can be replaced by a single integrated circuit. Furthermore, electronic system 1100 may be a subcomponent of a larger electronic system. It will also be appreciated that at least one of the memory modules 1000 contains an I/O device according to the present invention.

Figure 12:
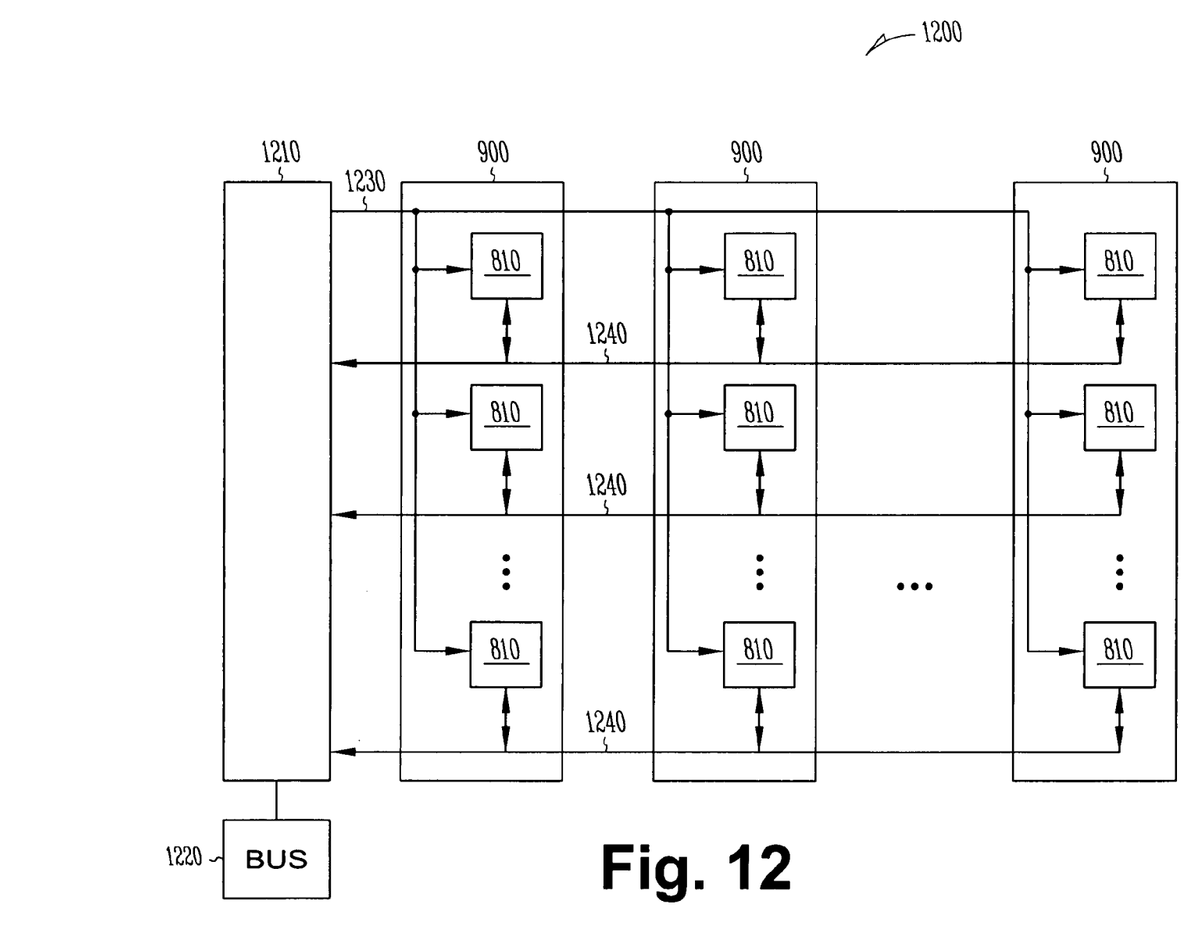
FIG. 12 is a block diagram of a memory system according to the present invention.

FIG. 12 shows one embodiment of an electronic system as memory system 1200. Memory system 1200 contains one or more memory modules 900 and a memory controller 1210. The memory modules 900 each contain one or more memory devices 810. In an embodiment, at least one of memory devices 810 includes an I/O device according to the present invention. Memory controller 1210 provides and controls a bidirectional interface between memory system 1200 and an external system bus 1220. Memory system 1200 accepts a command signal from the external bus 1220 and relays it to the one or more memory modules 900 on a command link 1230. Memory system 1200 provides for data input and data output between the one or more memory modules 900 and external system bus 1220 on data links 1240. In an embodiment, at least one of the memory modules 900 contains an I/O device according to the present invention. In an embodiment, the memory controller 1210 includes an I/O device according to the present invention.

Figure 13:
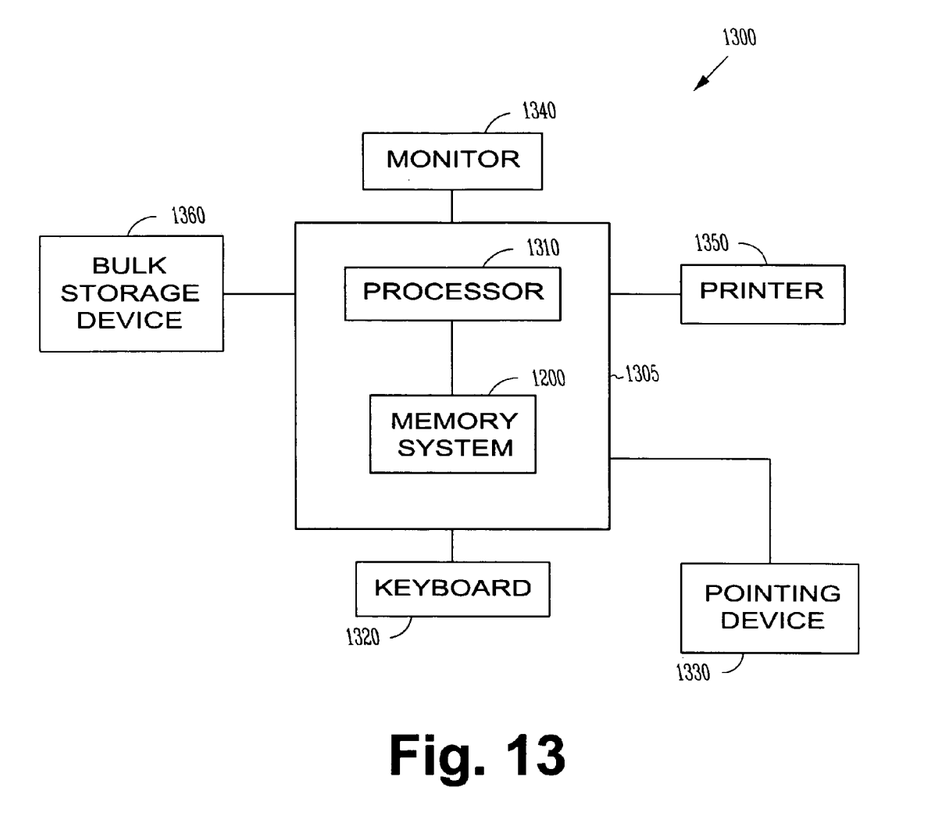
FIG. 13 is a block diagram of a computer system according to the present invention.

FIG. 13 shows a further embodiment of an electronic system as a computer system 1300. Computer system 1300 contains a processor 1310 and a memory system 1200 housed in a computer unit 1305. Computer system 1300 is but one example of an electronic system containing another electronic system, i.e., memory system 1200, as a subcomponent. Computer system 1300 optionally contains user interface components. Depicted in FIG. 13 are a keyboard 1320, a pointing device 1330, a monitor 1340, a printer 1350 and a bulk storage device 1360. It will be appreciated that other components are often associated with computer system 1300 such as modems, device driver cards, additional storage devices, etc. It will further be appreciated that the processor 1310 and memory system 1200 of computer system 1300 can be incorporated on a single integrated circuit. Such single package processing units reduce the communication time between the processor and the memory circuit. It will be appreciated that at least one of the processor 1310 and memory system 1200 contain the I/O device according to the present invention. In an embodiment, at least one of the communication lines within the computer system 1300 includes an I/O device according to the present invention. For example, an I/O driver is connected between the computer unit 1305 and at least one of the a keyboard 1320, a pointing device 1330, a monitor 1340, a printer 1350 and a bulk storage device 1360.

CONCLUSION

The I/O device of the present invention includes two cascode connected transistors that provide an I/O driving capability. The I/O device has design rules that are decoupled from the design of ESD protection. That is, the I/O device is designed primarily for speed of operation. The I/O device secondarily assists the ESD device. Thus, the I/O device acts as a current driver with the ESD device providing initial ESD protection. The ESD device has a lower activation threshold than the I/O device. The ESD protection device begins conducting before the I/O device during an ESD event. However, when the ESD event exceeds a threshold of the I/O device it will assist the ESD device. As a result, the I/O device has a dual role in the operation of the integrated circuit. The first role is to increase operating speed by designing with smaller active areas. This reduces the active area to well capacitances. The reduction in capacitance compared to conventional cascode ESD devices provides a faster I/O. Further, the I/O device to be without restricting the contact to gate spacing as would be required when designing an ESD device. Thus, the I/O device is designed for optimum switching and current requirements. The second role is to provide an ESD discharge assistance to the ESD device. However, the amount of current density is determined by the area through which the current flows. In conventional, cascode ESD device the current is a surface current. The present I/O device forces the current to be a deep bulk current in the well. Morever, the current flows through a larger surface area in the emitter and collector of the parasitic bipolar transistor.

The I/O device of the present invention provides the electrostatic discharge protection by having a parasitic bipolar transistor. However, the electrostatic discharge protection is used only to supplement the electrostatic discharge protection provided by an ESD device. The cascode connected transistors have their shared region separated by a non-conducting barrier. The separated parts of the shared region are connected together outside the shared region. The non-conducting barrier causes the current flowing through the I/O device to be a deep bulk current that primarily flows from the bottom surface of the drain active area into the well and from the well into the bottom surface of the source active area. Bottom surfaces of the active areas are larger than the side surface areas. This reduces the current per unit area. This in turn provides a circuit designer with two choices based on the needs of the specific application. First, reducing the current per unit area allows the area to drive more current density before the integrated circuit reaches its failure temperature, e.g., the melting temperature of the device, which in an embodiment is the melting point of the semiconductor substrate, e.g., silicon. Second, if there is no need to handle the current per unit area, then the area itself can be made smaller. For example, if the current density is the same as a convention cascode I/O driver, then the present I/O driver can be made smaller. More specifically, the bottom surface area of the drain is made smaller. This results in a lower capacitance (drain to well capacitance) and a faster operating speed. It is desirable to drive more current per unit area before the heat generated causes the device to fail during an ESD event. The present I/O device minimizes I/O capacitance, which is highly desirable to achieve faster operating speeds and communication between devices.

A further trait of the present I/O device is widening the base width of the parasitic transistors by separating the region of the common node between the cascode two transistors. Moreover, the current in the parasitic transistor during an ESD event has essentially no surface current and has bulk deep currents due to the non-conducting barrier in the common node. In contrast, conventional ESD devices have a substantial surface current and little bulk current below surface currents.

The I/O device of the present invention further allows a designer to focus on reducing capacitance and providing the required current for the application by removing the limitations of ESD devices from I/O device design considerations. That is, ESD design rules are not the primary consideration when designing the present I/O device. For example, contact to gate spacing rules for ESD devices is not a consideration for the present I/O device. Moreover, the present I/O device has a higher trigger voltage and thus a triggers only at higher currents than conventional combination ESD, I/O drivers. Further, the present I/O driver has a higher breakdown voltage and higher holding voltage for its parasitic bipolar transistor. Still further, the present I/O driver minimizes drain capacitance by decreasing the physical area of the drain.

One of skill in the art will understand that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

We claim:

1. A method, comprising:
   forming a first transistor in a substrate;
   forming a second transistor in the substrate having a shared source/drain region with the first transistor;
   forming a barrier in the shared region; and
   forming a non-conducting region between a drain region of the first transistor and a source region of the second transistor in a portion of a doped well, wherein the width of the non-conductive region is adjusted to provide a specified breakdown voltage of a parasitic feature.

2. The method of claim 1, wherein forming the barrier includes removing a portion of the shared region and inserting a non-conductive material in the portion of the shared region.

3. The method of claim 2, wherein removing the portion of the shared region includes etching the shared region.

4. The method of claim 1, wherein forming the first transistor includes forming a MOS transistor.

5. The method of claim 4, wherein forming the second transistor includes forming a MOS transistor.

6. The method of claim 4, wherein forming the first transistor includes forming an active well in the substrate.

7. The method of claim 6, wherein forming the barrier includes forming the barrier to extend into the active well in the substrate.

8. The method of claim 1, wherein forming a non-conducting region includes forming the non-conductive region using the barrier.

9. The method of claim 8, wherein the forming includes shaping the non-conductive region using the barrier and the well.

10. A method, comprising:
    simultaneously forming a first transistor and a second transistor in a substrate such that the first and second transistors are in a cascode configuration with a shared region;
    forming a barrier in the shared region; and
    forming a non-conducting region between the first transistor and the second transistor in a portion of a doped well, wherein the width of the non-conductive region is adjusted to provide a specified breakdown voltage of a parasitic bipolar transistor.

11. The method of claim 10, wherein forming the barrier includes removing a portion of the shared region and inserting a non-conductive material in the portion of the shared region.

12. The method of claim 11, wherein removing the portion of the shared region includes etching the shared region.

13. The method of claim 10, wherein forming the first transistor includes forming a MOS transistor.

14. The method of claim 13, wherein forming the second transistor includes forming a MOS transistor.

15. The method of claim 13, wherein forming the first transistor includes forming an active well in the substrate.

16. The method of claim 15, wherein forming the barrier includes forming the barrier to extend into the active well in the substrate.

17. A method, comprising:
    forming a doped region having a first conductivity type in a substrate;
    forming a set of cascode-connected transistors having channels in the doped region;
    forming a barrier in a shared region of the cascode-connected transistors; and
    forming a non-conducting region between the set of cascode-connected transistors in a portion of a doped well, wherein the width of the non-conductive region is to provide a specified breakdown voltage of a parasitic feature.

18. The method of claim 17, wherein forming the barrier includes removing a portion of the shared region and inserting a non-conductive material in the portion of the shared region.

19. The method of claim 18, wherein removing the portion of the shared region includes etching the shared region.

20. The method of claim 17, wherein forming a non-conducting region includes forming the non-conductive region using the barrier.

21. The method of claim 20, wherein the forming includes shaping the non-conductive region using the barrier and the well.

22. A method, comprising:
    forming a doped region having a first conductivity type in a substrate;

forming a set of cascode-connected transistors having channels in the doped region, wherein forming the set of transistors includes:
  forming a first diffusion region having a second conductivity type in the doped region;
  forming a second diffusion region having the second conductivity type in the doped region; and
  forming a third diffusion region having the second conductivity type in the doped region;
forming a barrier in the second diffusion region; and
forming a non-conducting region between the set of cascode-connected transistors in a portion of a doped well, wherein forming the non-conducting region includes adjusting the width of the non-conductive region to provide a specified parasitic breakdown voltage.

23. The method of claim 22, wherein forming the set of transistors includes masking a surface of the doped region to create openings, and supplying dopants through the openings to form the first, second, and third diffusion regions.

24. The method of claim 23, wherein supplying dopants through the openings includes simultaneously supplying dopants through the openings to form the first, second, and third diffusion regions.

25. The method of claim 23, wherein forming the barrier includes masking the second diffusion region after supplying dopants to the second region and etching an unmasked portion of the second diffusion region to form a well therein.

26. The method of claim 25, wherein forming the barrier includes filling the well with a non-conductive material.

27. The method of claim 25, wherein forming the barrier includes extending the barrier through the doped region.

28. The method of claim 23, wherein supplying dopants includes supplying N-type dopants.

29. The method of claim 22, wherein the first conductivity type is a P-type and the second conductivity type is an N-type.

30. A method, comprising:
  forming a doped region having a first conductivity type in a substrate;
  forming a set of cascode-connected transistors having channels in the doped region, wherein forming the set of transistors includes:
    forming a first diffusion region in the doped region;
    forming a second diffusion region in the doped region; and
    forming a third diffusion region in the doped region; and
  forming a barrier in the second diffusion region such that the barrier extends through the second diffusion region into the doped region, wherein forming a barrier includes forming the barrier with at least one of a width and a depth of the barrier being adjusted to provide a specified parasitic breakdown voltage.

31. The method of claim 30, wherein forming the set of transistors includes masking a surface of the doped region to create openings, and supplying dopants through the openings to form the first, second, and third diffusion regions.

32. The method of claim 31, wherein diffusing dopants through the openings includes simultaneously supplying dopants through the openings to form the first, second, and third diffusion regions.

33. The method of claim 31, wherein supplying dopants includes supplying N-type dopants.

34. The method of claim 30, wherein forming the barrier includes masking the second diffusion region after supplying dopants to the second region and etching an unmasked portion of the second diffusion region to form a well therein.

35. The method of claim 30, wherein forming the barrier includes filling the well with a non-conductive material.

36. The method of claim 30, wherein the first conductivity type is a P-type and the second conductivity type is an N-type.

37. A method for improving operation of a cascode-type driver in an output buffer of an integrated circuit, comprising:
  inserting a gap in the common node of the cascode-connected transistors, wherein a width of the gap is used to adjust a breakdown voltage of a parasitic transistor.

38. The method of claim 37, wherein inserting the gap includes extending the gap into an active well of a substrate.

* * * * *